United States Patent
Suenobu et al.

(10) Patent No.: US 11,862,432 B2
(45) Date of Patent: Jan. 2, 2024

(54) MICROWAVE HEATING DEVICE

(71) Applicant: MITSUBISHI ELECTRIC CORPORATION, Tokyo (JP)

(72) Inventors: Hiroshi Suenobu, Tokyo (JP); Shingo Yamaura, Tokyo (JP); Tai Tanaka, Tokyo (JP); Michio Takikawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 508 days.

(21) Appl. No.: 17/251,449

(22) PCT Filed: Jul. 2, 2018

(86) PCT No.: PCT/JP2018/025058
§ 371 (c)(1),
(2) Date: Dec. 11, 2020

(87) PCT Pub. No.: WO2020/008497
PCT Pub. Date: Jan. 9, 2020

(65) Prior Publication Data
US 2021/0249229 A1  Aug. 12, 2021

(51) Int. Cl.
*H05B 6/70* (2006.01)
*H05B 6/80* (2006.01)
*H01J 37/32* (2006.01)

(52) U.S. Cl.
CPC ... *H01J 37/32201* (2013.01); *H01J 37/32311* (2013.01); *H01J 37/32926* (2013.01); *H05B 6/70* (2013.01); *H05B 6/806* (2013.01)

(58) Field of Classification Search
CPC .......... H01J 37/32201; H01J 37/32311; H01J 37/32926; H05B 6/70; H05B 6/806; H05B 6/686

(Continued)

(56) References Cited

U.S. PATENT DOCUMENTS

| 4,476,362 A * | 10/1984 | Kusunoki | H05B 6/72 219/757 |
| 5,272,299 A * | 12/1993 | Ovadia | H05B 6/766 219/400 |
| 6,297,485 B1 | 10/2001 | Kim et al. | |

FOREIGN PATENT DOCUMENTS

| JP | 51-87837 A | 7/1976 |
| JP | 2000-150137 A | 5/2000 |
| JP | 2001-35649 A | 2/2001 |

OTHER PUBLICATIONS

Francis F. Chen, translated by Taijiro Uchida, "Introduction to Plasma Physics", 1977, Maruzen Co., Ltd., pp. 142-144, total 7 pages.

(Continued)

*Primary Examiner* — Quang T Van
(74) *Attorney, Agent, or Firm* — Birch, Stewart, Kolasch & Birch, LLP

(57) ABSTRACT

A radiation element for radiating a microwave into the heating chamber at least one hollow dielectric member in which a gas is sealed, the hollow dielectric member having electrodes and a control unit having a plasma control unit for controlling the state of the hollow dielectric member and a current adjustment unit for adjusting a current to be applied to the electrodes of the hollow dielectric member under the control of the plasma control unit, the current adjustment unit being connected to the electrodes; and wherein the plasma control unit controls the state of the hollow dielectric member to put into one of states of: a plasma state in which the microwave is reflected by the gas; a plasma state in which the microwave is absorbed by the gas; and a gas state in which the microwave is allowed to be transmitted through the gas.

10 Claims, 14 Drawing Sheets

(58) Field of Classification Search
USPC ....... 219/702, 710, 720, 681, 682, 683, 685,
219/400, 401, 121.43, 121.3, 6, 121.52,
219/121.44; 99/451, 468, 474, 467, 325,
99/330
See application file for complete search history.

(56) References Cited

OTHER PUBLICATIONS

Extended European Search Report dated May 14, 2021 in European Patent Application No. 18 925 407.1.

* cited by examiner

⬤ : Plasma State (Reflection Mode)
◯ : Gas State

○ : Plasma State (Reflection Mode)
● : Plasma State (Absorption Mode)

◯ : Plasma State (Absorption Mode: Value of Power Is Small)

◉ : Plasma State (Absorption Mode: Value of Power Is Large)

MICROWAVE HEATING DEVICE

TECHNICAL FIELD

The present invention relates to a technique for heating a heating target by using a microwave.

BACKGROUND ART

As represented by microwave ovens, techniques using microwaves are widely known for heating a heating target. However, during heating using a microwave, a problem arises in that, at each of positions corresponding to the nodes of a microwave standing wave generated in a heating chamber, the energy used for heating (hereinafter, referred to as heating energy) is low, so that uneven heating may occur.

As methods for solving this problem, there are known: a method in which the heating target is rotated by using a turntable to thereby stir the heating energy to be received by the heating target; and a method in which a microwave radiation device is rotated to thereby stir the distribution of the heating energy generated in a heating chamber.

Furthermore, in Patent Literature 1, there is proposed a method of performing equalization of the heating energy by using plasma. A high-frequency heating device disclosed in Patent Literature 1 equalizes the heating energy by employing the electromagnetic-wave reflection property of the plasma. In the heating device, many neon tubes that generate plasma therein are disposed to be placed under a heating target in the heating chamber. The microwave heating energy is equalized in such a manner that, when the microwave supplied from a microwave generation source into the heating chamber reaches the neon tubes, plasma is generated in the neon tubes when the microwave heating energy is high at these tubes, to reflect the microwave toward positions at which the heating energy is low.

CITATION LIST

Patent Literature

Patent Literature 1: Japanese Patent Application Laid-open No. S51-087837

SUMMARY OF INVENTION

Technical Problem

In the high-frequency heating device described in the foregoing Patent Literature 1, the microwave does not always reach the neon tubes that have high heating energy, so that a case may arise in which the microwave does not hit the heating target to thereby cause energy loss in the heating chamber. Furthermore, because the beam of the microwave radiated into the closed space has width, it is not possible to make a large difference in energy between the closely adjacent neon tubes. As described above, in the high-frequency heating device described in Patent Literature 1, there is a problem in which it is difficult to control the reflection direction of the microwave, so that the effect of equalizing the heating energy may be deteriorated.

This invention has been made to solve the problem as described above, and an object thereof is to accomplish equalization of heating energy in a heating chamber by controlling, using plasma, the distribution of the heating energy.

Solution to Problem

A microwave heating device according to the invention comprises: a heating chamber capable of storing therein a heating target and having walls each made of a conductor; a microwave generator to generate a microwave; at least one radiation element to radiate, into the heating chamber, the microwave generated by the microwave generator, the radiation element being provided at one of the walls; at least one hollow dielectric member in which a gas is sealed, the hollow dielectric member having electrodes at both end portions thereof; and processing circuitry to control a state of the hollow dielectric member, and to adjust a current to be applied to the electrodes of the hollow dielectric member the processing circuitry being connected to the electrodes; wherein the at least one hollow dielectric member is provided along one of the walls which is other than the wall at which the radiation element is provided; and wherein the processing circuitry controls the state of the hollow dielectric member so that the hollow dielectric member is put into one of states of: a plasma state in which the microwave is reflected by the gas; a plasma state in which the microwave is absorbed by the gas; and a gas state in which the microwave is allowed to be transmitted through the gas.

Advantageous Effects of Invention

According to the invention, it is possible, using plasma, to control the distribution of heating energy in the heating chamber. This makes it possible to accomplish equalization of the heating energy in the heating chamber, to thereby eliminate uneven heating of the heating target.

BRIEF DESCRIPTION OF DRAWINGS

FIG. 7.

FIG. 9.

DESCRIPTION OF EMBODIMENTS

Hereinafter, for illustrating the invention in more detail, embodiments for carrying out the invention will be described with reference to the accompanying drawings.

Embodiment 1

Figure 1:
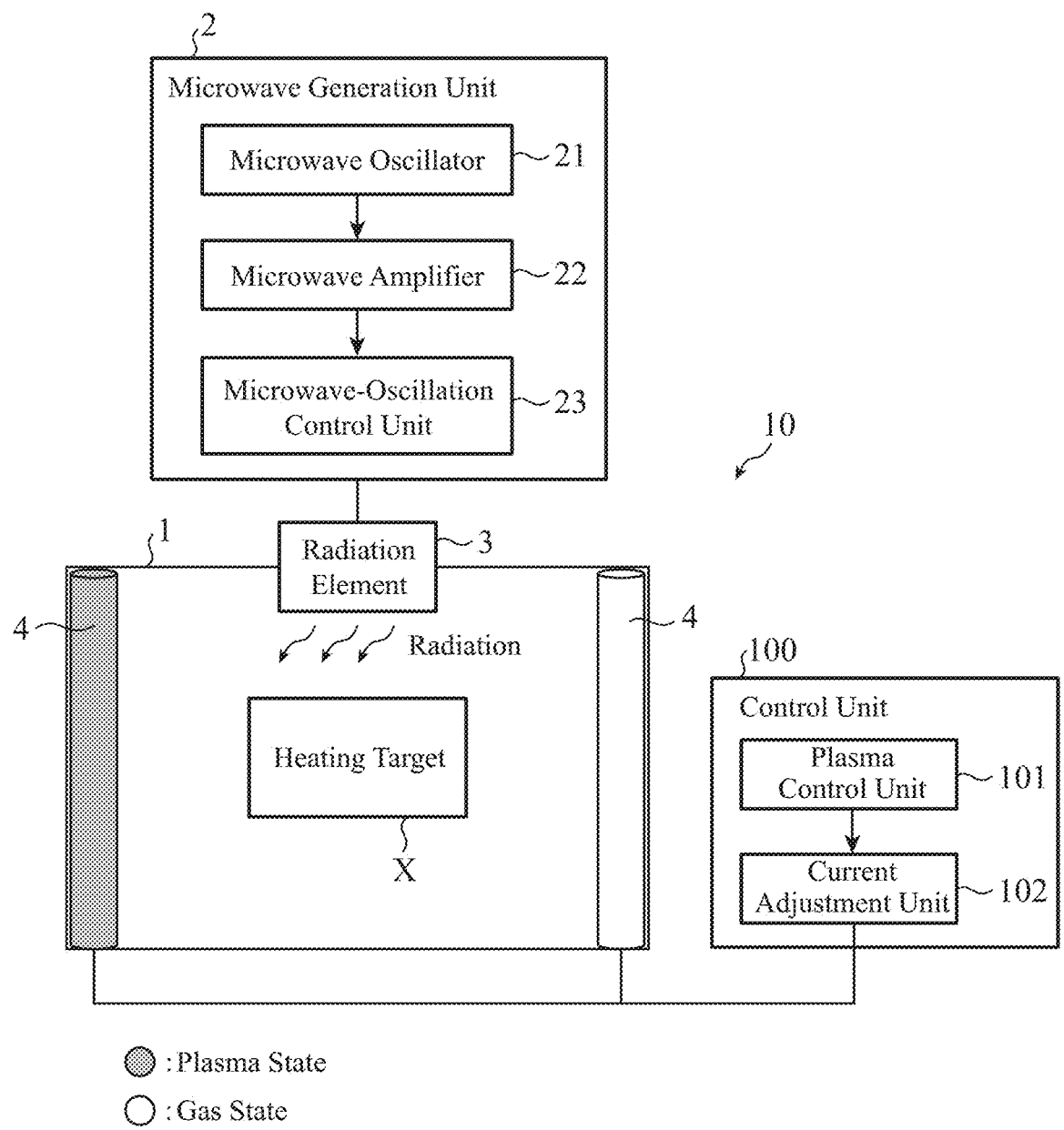
FIG. 1 is a lateral-side schematic view showing a configuration of a microwave heating device according to Embodiment 1.

FIG. 1 is a lateral-side schematic view showing a configuration of a microwave heating device 10 according to Embodiment 1.

Figure 2:
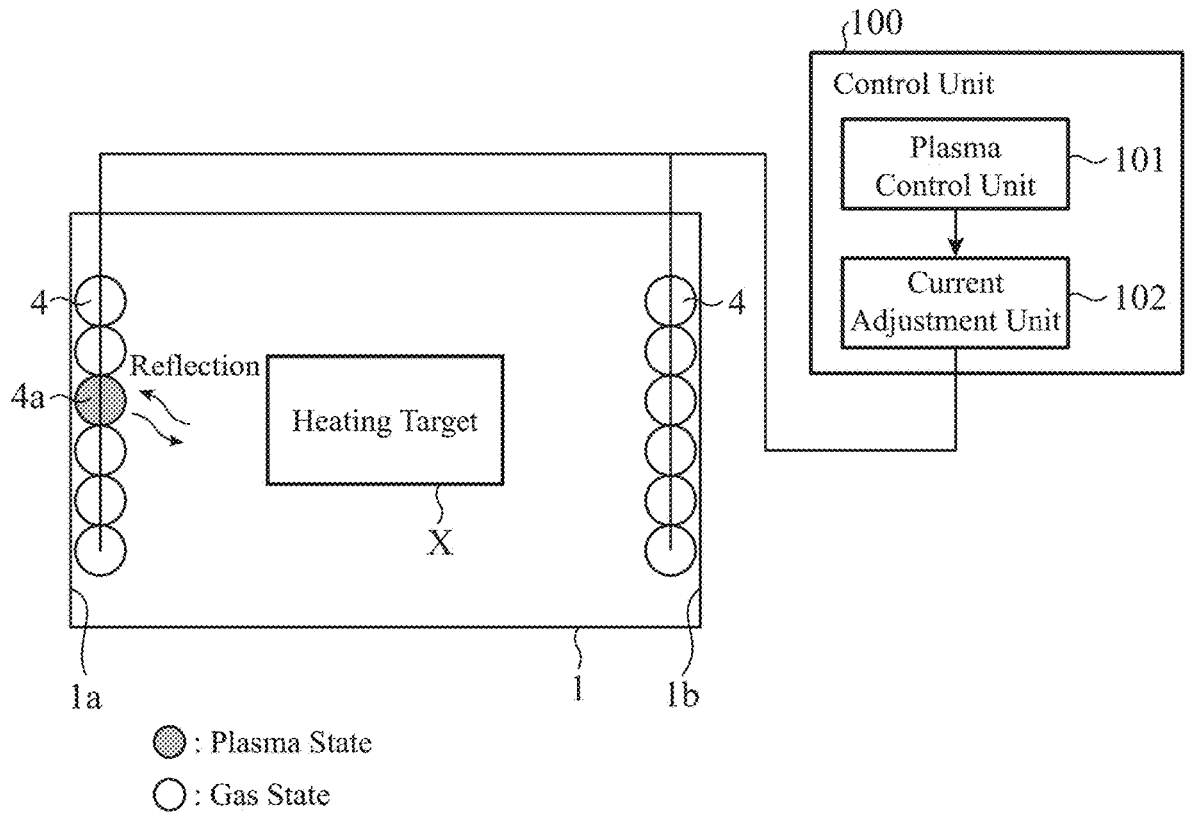
FIG. 2 is a top-side schematic view showing an internal configuration of the microwave heating device according to Embodiment 1.

FIG. 2 is a top-side schematic view showing an internal configuration of the microwave heating device 10 according to Embodiment 1. In FIG. 2, the top face of a heating chamber 1, a microwave generation unit 2 and a radiation element 3 are omitted from the illustration. The same applies to the top-side schematic views for other embodiments to be described later.

The microwave heating device 10 includes the heating chamber 1, the microwave generation unit 2, the radiation element 3, hollow dielectric members 4 and a control unit 100.

The heating chamber 1 is a casing capable of storing therein a heating target X and having walls made of conductors. The microwave generation unit 2 includes a microwave oscillator 21, a microwave amplifier 22 and a microwave-oscillation control unit 23. The microwave oscillator 21 is a device that oscillates a microwave under the control of the microwave-oscillation control unit 23. The microwave amplifier 22 is a device that amplifies the microwave oscillated by the microwave oscillator 21. The microwave-oscillation control unit 23 controls oscillation of the microwave in the microwave oscillator 21.

The radiation element 3 is connected to the microwave generation unit 2 and radiates the microwave generated in the microwave generation unit 2 into the heating chamber 1. The radiation element 3 is provided inside the heating chamber 1 and at one of the top-side wall, the bottom-side wall and the lateral-side walls. In FIG. 1, a case is shown where the radiation element 3 is provided inside the heating chamber 1 and at the top-side wall.

The hollow dielectric members 4 each generate plasma in response to the application of a current by a current adjustment unit 102 to be described later in the control unit 100.

Figure 3:
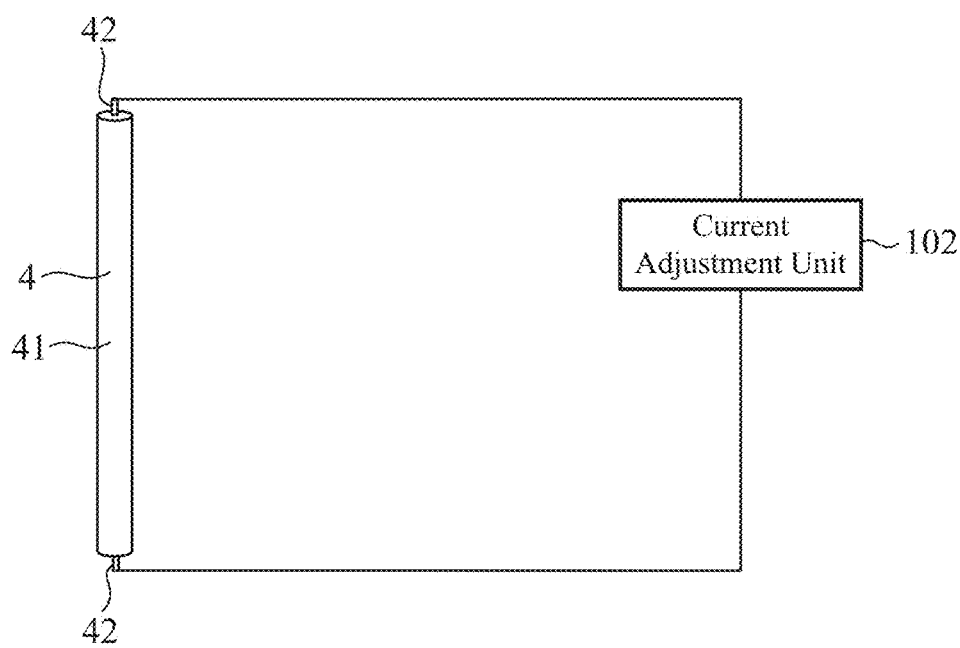
FIG. 3 is a diagram showing a configuration of a hollow dielectric member in the microwave heating device according to Embodiment 1.

FIG. 3 is a diagram showing a configuration of the hollow dielectric member 4 in the microwave heating device 10 according to Embodiment 1.

The hollow dielectric member 4 is sealed with the inside thereof filled with a gas 41, and electrodes 42 provided at both end portions thereof. The electrodes 42 are connected to the current adjustment unit 102. The gas 41 in the hollow dielectric member 4 is switched, depending on what current is applied from the current adjustment unit 102, between a plasma state in which plasma is generated and a gas state in which no plasma is generated.

It is desired that the hollow dielectric member 4 be formed of a material with a low dielectric loss and a low dielectric constant. Further, it is desired that the gas 41 with which the inside of the hollow dielectric member 4 is filled be a gas containing a Group 18 element (rare gas element); however, a medium of nitrogen, oxygen or the like, or a mixed medium of nitrogen and oxygen may also be used. Further, in order to adjust the plasma generation level, a medium such as Hg, a Fractogel® TMAE or the like may be added to the gas 41.

One or more hollow dielectric members 4 are provided inside the heating chamber 1 along one of the walls other than the wall at which the radiation element 3 is provided. In FIG. 2, a case is shown where six hollow dielectric members 4 are provided along a lateral-side wall 1a of the heating chamber 1, and six hollow dielectric members 4 are provided along another lateral-side wall 1b thereof. Note that the wall(s) along which the hollow dielectric members 4 are provided, and the number of the provided hollow dielectric members 4, are not limited to the configuration shown in FIG. 2, and may be determined freely.

The control unit 100 includes a plasma control unit 101 and the current adjustment unit 102.

The plasma control unit 101 controls the current adjustment unit 102. The plasma control unit 101 has, for example, a timer (not illustrated), and makes switching among current-application patterns in response to the counting of the timer, to thereby control the current adjustment unit 102. Here, the application patterns are pieces of information in which multiple application settings are specified as patterns, each indicating: which hollow dielectric member 4 is subject to the application; the current value of a current to be applied; an application time; and the like.

The current adjustment unit 102 adjusts the current to be applied to the electrodes 42 of each of the hollow dielectric members 4, under the control of the plasma control unit 101. Specifically, the current adjustment unit 102 adjusts the current to be applied to the electrodes 42 of the hollow dielectric member 4, to thereby set the gas 41 with which the inside of the hollow dielectric member 4 is filled into the plasma state in which plasma is generated or the gas state in which no plasma is generated so that the microwave is allowed to be transmitted. Further, when the gas 41 in the hollow dielectric member 4 is in the plasma state, the current adjustment unit 102 further adjusts the current value of the current to be applied, to thereby perform setting of the plasma state so that it is switched between a reflection mode in which the microwave is reflected and an absorption mode in which the microwave is absorbed.

Under the control of the plasma control unit 101, the current adjustment unit 102 sets the state of the gas 41 in each of one or more hollow dielectric members 4 among the provided hollow dielectric members 4, to the plasma state. This causes the microwave having entered the heating chamber 1 to be reflected or absorbed by the hollow dielectric member 4 in the plasma state, so that the heating energy distribution in the heating chamber 1 varies. Multiple patterns for setting plasma states are made ready, and the current adjustment unit 102 changes the pattern of the plasma states for every time period. Thereby, the distribution of heating energy in the heating chamber 1 is equalized, so that uneven heating of the heating target X is suppressed.

In the example of FIG. 2, a case is shown where the state of the gas 41 in the hollow dielectric member 4a, one of the six hollow dielectric members 4 provided along the lateral-side wall 1a, is set to the plasma state, and the other hollow dielectric members 4 are each set into the gas state. Note that the hollow dielectric member 4 to be set into the plasma state is not limited to one hollow dielectric member 4a, and multiple hollow dielectric members 4 may be each set into the plasma state.

As described above, according to Embodiment 1, a configuration is provided which includes: at least one hollow dielectric member 4 in which the gas 41 is sealed, the hollow dielectric member 4 having the electrodes 42 at both end portions thereof; and the control unit 100 having the plasma control unit 101 for controlling the state of the hollow dielectric member 4, and the current adjustment unit 102 for adjusting a current to be applied to the electrodes 42 of the hollow dielectric member 4, under the control of the plasma control unit 101, the current adjustment unit 102 being connected to the electrodes 42. The at least one hollow dielectric member 4 is provided along the wall other than the wall at which the radiation element 3 is provided. The plasma control unit 101 controls the state of the hollow dielectric member 4 so that it is put into one of the states of the plasma state in which the microwave is reflected by the gas, the plasma state in which the microwave is absorbed by the gas, and the gas state in which the microwave is allowed to be transmitted through the gas.

Accordingly, it is possible to switch the state of the hollow dielectric member 4 into one of the states of the plasma state in which the microwave is reflected by the gas, the plasma state in which the microwave is absorbed by the gas, and the gas state in which the microwave is allowed to be transmitted through the gas, to thereby change the distribution of microwave heating energy in the heating chamber. Thus, the microwave heating energy can be equalized, and this makes it possible to suppress uneven heating of the heating target.

Embodiment 2

Figure 4:
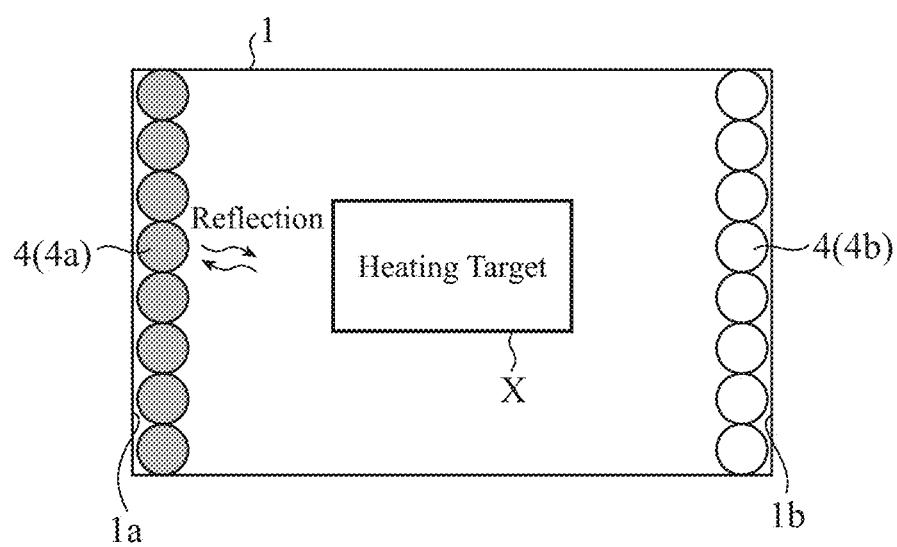
FIG. 4 is a top-side schematic view showing an internal configuration of a microwave heating device according to Embodiment 2.

FIG. 4 is a top-side schematic view showing an internal configuration of a microwave heating device 10 according to Embodiment 2. In FIG. 4, the control unit 100 is omitted from the illustration.

Further, with respect to the parts same as or equivalent to the components of the microwave heating device 10 according to Embodiment 1, the same reference numerals as the reference numerals used in Embodiment 1 are given thereto, and description thereof will be omitted or simplified.

Two or more hollow dielectric members 4 are provided in a line inside the heating chamber 1 along at least one of the walls other than the wall at which the radiation element 3 is provided. In FIG. 4, a case is shown where eight hollow dielectric members 4 are provided in a line along the lateral-side wall 1a and eight hollow dielectric members 4 are provided in a line along the lateral-side wall 1b.

Under the control of the plasma control unit 101, the current adjustment unit 102 puts two or more hollow dielectric members 4 provided in a line among the provided hollow dielectric members 4, into the plasma state in which the microwave is reflected. In FIG. 4, a case is shown where the eight hollow dielectric members 4a provided in a line along the lateral-side wall 1a are each put into the plasma state in which the microwave is reflected. Further, in FIG. 4, a case is shown where the eight hollow dielectric members 4b provided in a line along the lateral-side wall 1b are each put into the gas state in which no plasma is generated. When two or more hollow dielectric members 4 provided in a line are each put into the plasma state in which the microwave is reflected, a virtual reflection surface for reflecting the microwave is formed. The microwave having entered the heating chamber 1 is reflected by the reflection surface formed by the hollow dielectric members 4, to thereby cause the heating energy distribution in the heating chamber 1 to vary.

Subsequently, under the control of the plasma control unit 101, the current adjustment unit 102 changes the state of each of the hollow dielectric members 4a put into the plasma state in which the microwave is reflected, into the gas state in which no plasma is generated so that the microwave is allowed to be transmitted. Namely, under the control of the plasma control unit 101, the current adjustment unit 102 makes switching of the hollow dielectric members 4a between the plasma state and the gas state, so that switching between formation of the reflection surface and elimination of the formed reflection surface is performed. Due to the formation and the elimination of the reflection surface by the hollow dielectric members 4, the distribution of heating energy varies temporally to be equalized, so that uneven heating of the heating target X is suppressed.

As described above, according to Embodiment 2, two or more hollow dielectric members 4 are provided in in a line along at least one of the walls other than the wall at which the radiation element 3 is provided; the plasma control unit 101 controls the states of respective two or more hollow dielectric members among the hollow dielectric members 4 provided in a line so that the respective two or more hollow dielectric members are put into the plasma state in which the microwave is reflected.

Accordingly, the virtual reflection surface due to plasma is formed, so that it is possible to change the distribution of microwave heating energy in the heating chamber. Thus, the microwave heating energy can be equalized, and this makes it possible to suppress uneven heating of the heating target.

Embodiment 3

Figure 5:
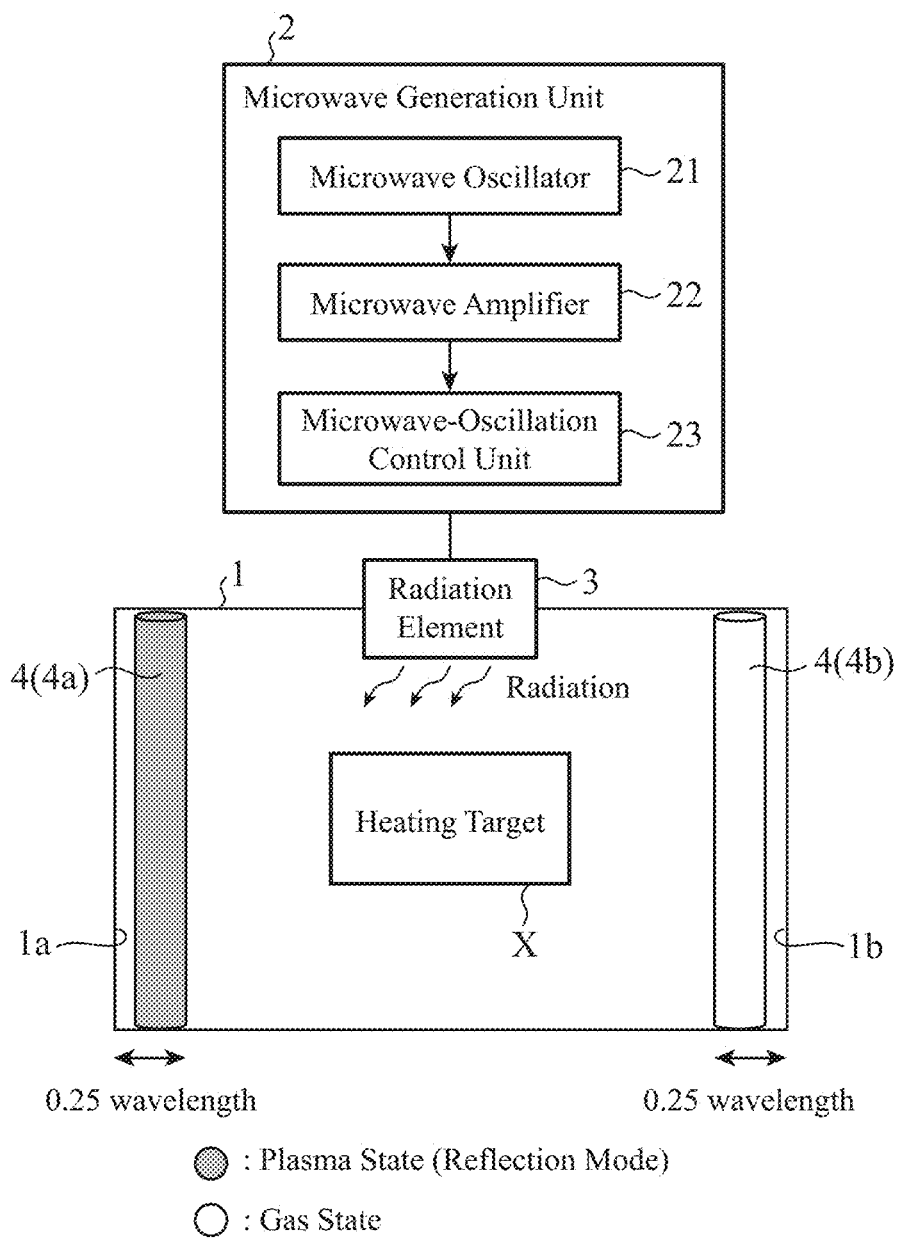
FIG. 5 is a lateral-side schematic view showing a configuration of a microwave heating device according to Embodiment 3.

FIG. 5 is a lateral-side schematic view showing a configuration of a microwave heating device 10 according to Embodiment 3.

Figure 6:
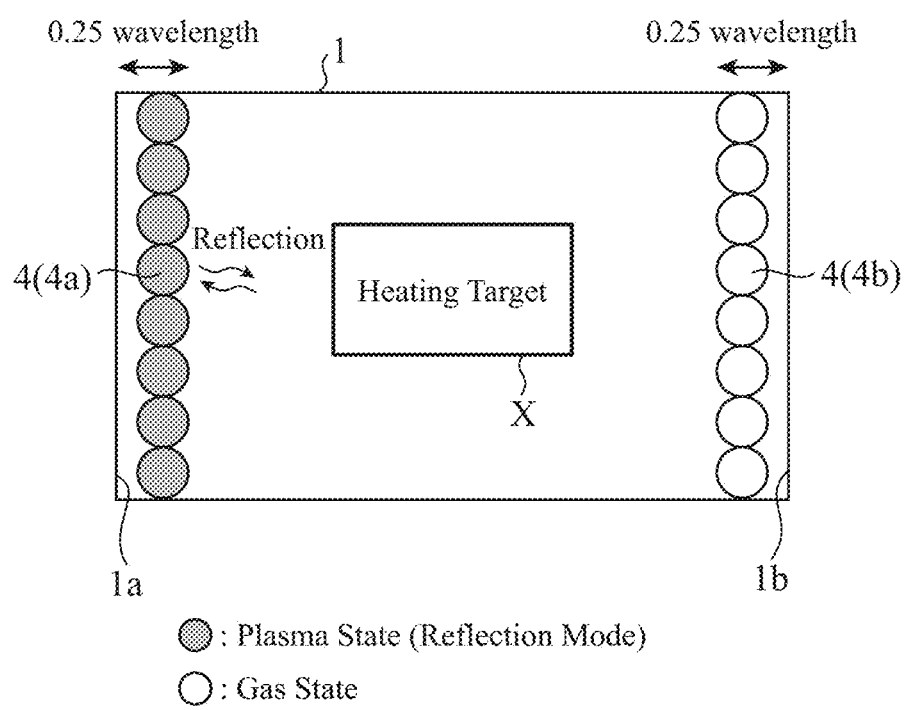
FIG. 6 is a top-side schematic view showing an internal configuration of the microwave heating device according to Embodiment 3.

FIG. 6 is a top-side schematic view showing an internal configuration of the microwave heating device 10 according to Embodiment 3.

In FIG. 5 and FIG. 6, the control unit 100 is omitted from the illustration. Further, with respect to the parts same as or equivalent to the components of the microwave heating device 10 according to Embodiment 1 or 2, the same reference numerals as the reference numerals used in Embodiment 1 or 2 are given thereto, and description thereof will be omitted or simplified.

Two or more hollow dielectric members 4 are provided inside the heating chamber 1 along each one of two or more walls (a first wall and a second wall), that are other than the wall at which the radiation element 3 is provided and that are opposite to each other across the heating target X. Further, each of the hollow dielectric members 4 is provided at a position about 0.25 wavelength away from the corresponding wall.

In FIG. 5 and FIG. 6, a case is shown where eight hollow dielectric members 4a are provided in a line along the lateral-side wall 1a (the first wall) of the heating chamber 1 and eight hollow dielectric members 4b are provided in a line along the lateral-side wall 1b (the second wall) of the heating chamber 1. Further, the hollow dielectric members 4a are each provided at a position about 0.25 wavelength away from the wall 1a, and the hollow dielectric members 4b are each provided at a position about 0.25 wavelength away from the wall 1b. When multiple hollow dielectric members 4 provided in a line are each put into the plasma state in which the microwave is reflected, a virtual reflection surface for reflecting the microwave is formed. The microwave having entered the heating chamber 1 is reflected by the reflection surface formed by the hollow dielectric members 4, to thereby cause the heating energy distribution in the heating chamber 1 to vary.

Note that the number of the provided hollow dielectric members 4 is not limited to the number shown in FIG. 6, and may be determined freely if it is a number which enables a virtual reflection surface to be formed by either one of the sets of the hollow dielectric members 4 opposite to each other across the heating target X.

Under the control of the plasma control unit 101, the current adjustment unit 102 puts the row of the hollow dielectric members 4a provided in a line along the wall 1a that is one of the opposite walls, into the plasma state in which the microwave is reflected. At the same time, the row of the hollow dielectric members 4b provided in a line along the other wall 1b opposite to the wall 1a, is put into the gas state in which no plasma is generated so that the microwave is allowed to be transmitted (hereinafter, referred to as a first set of states).

Then, under the control of the plasma control unit 101, the current adjustment unit 102 puts the row of the hollow dielectric members 4a provided in a line along the wall 1a and each being in the plasma state in which the microwave is reflected, into the gas state, and puts the row of the hollow dielectric members 4b provided in a line along the other wall 1b opposite to the wall 1a and each being in the gas state, into the plasma state in which the microwave is reflected (hereinafter, referred to as a second set of states).

The plasma control unit 101 performs control to make switching between the first set of states and the second set of states described above, alternately at predetermined time intervals. Under the control of the plasma control unit 101, the current adjustment unit 102 adjusts the currents to be applied, to thereby switch the rows of the hollow dielectric members 4a, 4b between the first set of states and the second set of states described above, alternately at the predetermined time intervals. Accordingly, the position of the microwave standing wave generated in the heating chamber 1 is changed.

With reference to FIG. 7, description will be made about a variation in the position of the microwave standing wave generated in the heating chamber 1.

Figure 7A:
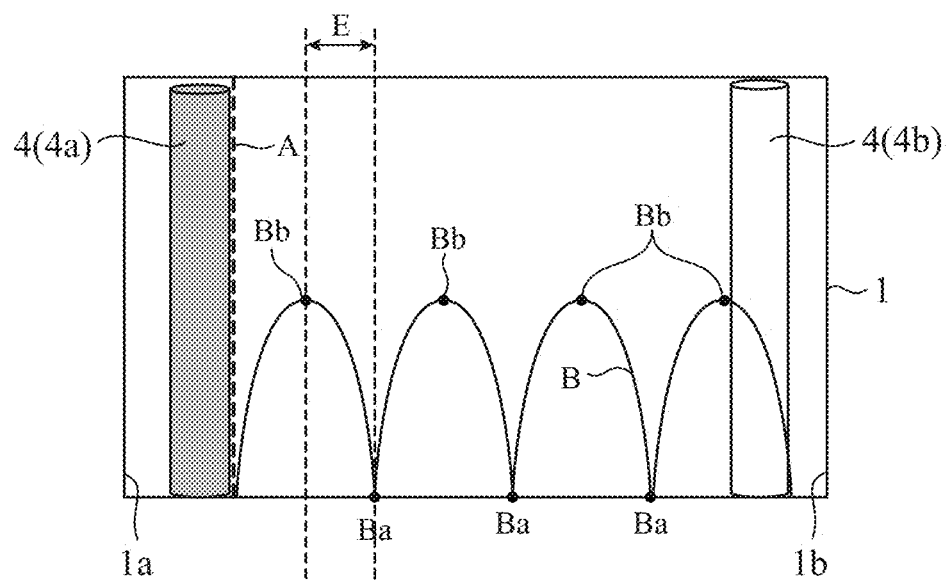
FIG. 7A and FIG. 7B are diagrams each showing a position of a standing wave in the microwave heating device according to Embodiment 3.
Figure 7B:
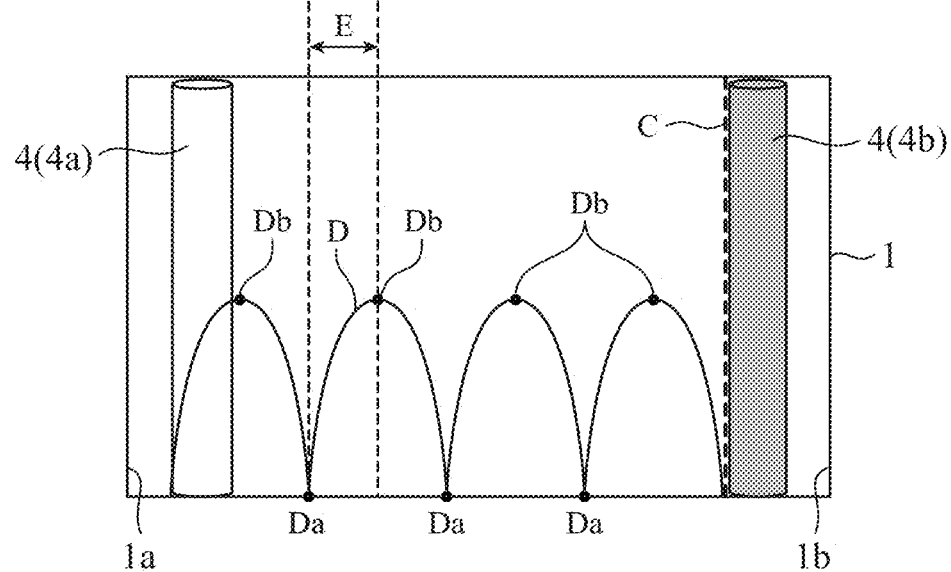

FIG. 7 includes diagrams each showing a position of the standing wave in the microwave heating device 10 according to Embodiment 3. Note that FIG. 7A shows the position of the microwave standing wave in the first set of states described above, and FIG. 7B shows the position of the microwave standing wave in the second set of states described above.

As shown in FIG. 7A and FIG. 7B, the row of the hollow dielectric members 4a is placed at a position 0.25 wavelength away from the wall 1a, and the row of the hollow dielectric members 4b is placed at a position 0.25 wavelength away from the wall 1b opposite to the wall 1a across the heating target X.

First, as shown in FIG. 7A, under the control of the plasma control unit 101, the current adjustment unit 102 puts the row of the hollow dielectric members 4a into the plasma state in which the microwave is reflected, and puts the row of the hollow dielectric members 4b into the gas state (the first set of states). As shown in FIG. 7A, in the first set of states, a virtual reflection surface A is formed by the row of the hollow dielectric members 4a. The thus-formed virtual reflection surface A reflects the microwave, resulting in the waveform of a standing wave B shown in FIG. 7A. The nodes of the standing wave B are placed at positions Ba, and the antinodes of the standing wave B are placed at positions Bb.

Then, as shown in FIG. 7B, under the control of the plasma control unit 101, the current adjustment unit 102 puts the row of the hollow dielectric members 4b into the plasma state in which the microwave is reflected, and puts the row of the hollow dielectric members 4a into the gas state (the second set of states). As shown in FIG. 7B, in the second set of states, a virtual reflection surface C is formed by the row of the hollow dielectric members 4b. The thus-formed virtual reflection surface C reflects the microwave, resulting in the waveform of a standing wave D shown in FIG. 7B. The nodes of the standing wave D are placed at positions Da, and the antinodes of the standing wave D are placed at positions Db.

The positions of the nodes of the standing wave in the first set of states (the positions Ba in FIG. 7A) coincide with the positions of the antinodes of the standing wave in the second set of states (for example, the positions Db in FIG. 7B). Likewise, the positions of the nodes of the standing wave in the second set of states (the positions Da in FIG. 7B) coincide with the positions of the antinodes of the standing wave in the first set of states (for example, the positions Bb in FIG. 7A). In the case represented by FIG. 7A and FIG. 7B, when switching between the first set of states and the second set of states is performed, the positions of the nodes of the standing wave are shifted by a distance indicated by an arrow E.

When the plasma control unit 101 and the current adjustment unit 102 switch the states of the hollow dielectric members 4 between the first set of states and the second set of states, the positions of the nodes and antinodes of the standing wave are shifted and thus the heating energy distribution is equalized on a time-average basis, so that uneven heating of the heating target X is suppressed.

As described above, according to Embodiment 3, two or more hollow dielectric members 4 are provided in a line at respective positions about 0.25 wavelength away from the wall 1a other than the wall at which the radiation element 3 is provided, and two or more hollow dielectric members 4 are provided in a line at respective positions about 0.25 wavelength away from the wall 1b other than the wall at which the radiation element 3 is provided, the wall 1b being opposite to the wall 1a across the heating target X. The plasma control unit 101 performs control to make switching between: the first set of states in which the hollow dielectric members 4a provided in a line along the wall 1a are put into the plasma state in which the microwave is reflected while the hollow dielectric members 4b provided in a line along the wall 1b are put into the gas state in which the microwave is allowed to be transmitted; and the second set of states in which the hollow dielectric members 4b provided in a line along the wall 1b are put into the plasma state in which the microwave is reflected while the hollow dielectric members 4a provided in a line along the wall 1a are put into the gas state in which the microwave is allowed to be transmitted.

Accordingly, the positions of the nodes and antinodes of the standing wave are shifted and thus the heating energy distribution can be equalized on a time-average basis. Thus, it is possible to suppress uneven heating of the heating target.

Embodiment 4

In Embodiment 4, a configuration in which the currents to be applied to the hollow dielectric members 4 are controlled on the basis of a temperature distribution in the heating chamber 1, will be described.

Figure 8:
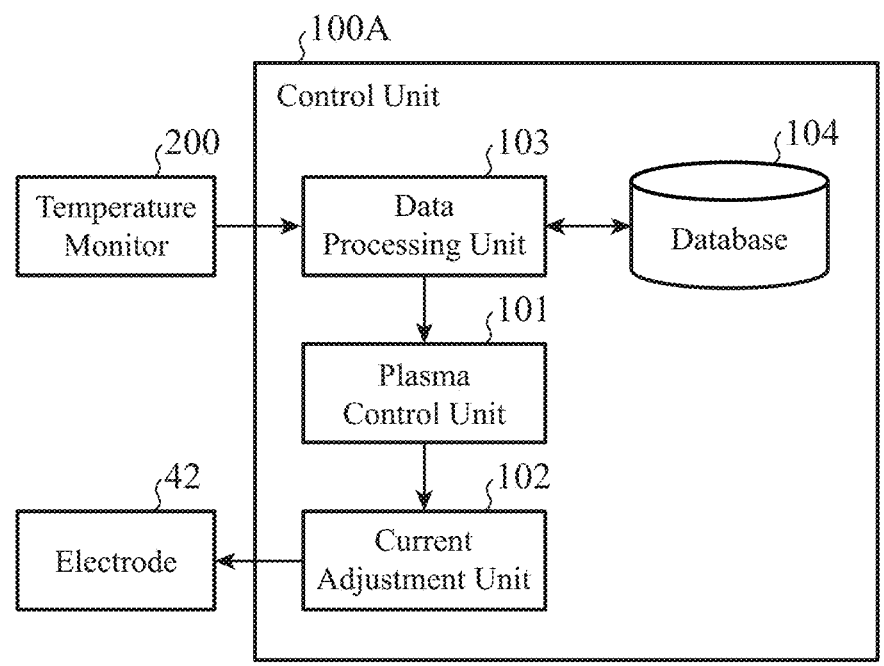
FIG. 8 is a block diagram showing a configuration of a control unit in a microwave heating device according to Embodiment 4.

FIG. 8 is a block diagram showing a configuration of a control unit 100A in a microwave heating device 10 according to Embodiment 4.

The control unit 100A in the microwave heating device 10 of Embodiment 4 is configured by the addition of a data processing unit 103 and a database 104 to the control unit 100 shown in each of Embodiments 1 to 3.

Note that, in the following, with respect to the parts same as or equivalent to the components of the microwave heating device 10 according to each of Embodiments 1 to 3, the same reference numerals as the reference numerals used in each of Embodiment 1 to 3 are given thereto, and description thereof will be omitted or simplified.

The control unit 100A includes the data processing unit 103, the database 104, the plasma control unit 101 and the current adjustment unit 102. The control unit 100A is connected wirelessly or by wire to a temperature monitor 200 provided in the heating chamber 1. The temperature monitor 200 includes, for example, a temperature sensor, and acquires temperature information indicating a temperature distribution in the heating chamber 1. The temperature monitor 200 only has to be able to acquire the temperature information of the heating chamber 1, and is provided at an appropriate position.

The data processing unit 103 refers to the temperature information inputted from the temperature monitor 200 to thereby determine whether or not there is an unheated region in a region near the heating target X. Here, when, for example, a recommended position for the heating target X to be placed is predetermined in the heating chamber 1, a region within a predetermined distance from the position is set as the region near the heating target X. Further, it is also allowed to identify the heating target X from imaging data obtained by imaging the inside of the heating chamber 1, to thereby set a region in which the heating target X is placed, as the region near the heating target X.

When having determined that there is an unheated region in the region near the heating target X, the data processing unit 103 refers to the database 104 to thereby acquire a control setting matched with the temperature information inputted from the temperature monitor 200. The data processing unit 103 outputs the acquired control setting to the plasma control unit 101. The database 104 is a storing region for associating each piece of temperature information with a corresponding control setting indicating values and application times of the currents to be applied to the electrodes 42 of the hollow dielectric members 4, and for storing the resultant data.

The plasma control unit 101 controls the current adjustment unit 102 in accordance with the control setting inputted from the data processing unit 103. The current adjustment unit 102 adjusts the currents to be applied to the electrodes 42 of the hollow dielectric members 4, under the control of the plasma control unit 101.

Next, description will be made about hardware configuration examples of the microwave heating device 10.

Figure 9A:
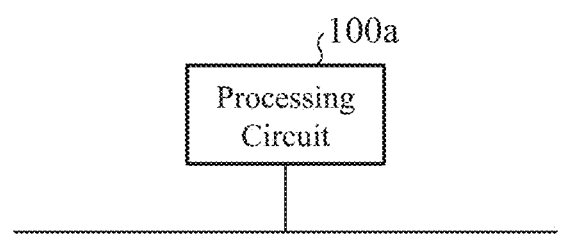
FIG. 9A and FIG. 9B are diagrams each showing a hardware configuration example of the control unit in the microwave heating device according to Embodiment 4.
Figure 9B:
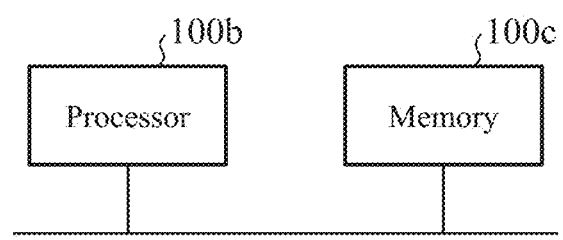

FIG. 9A and FIG. 9B are diagrams each showing a hardware configuration example of the control unit 100A in the microwave heating device 10 according to Embodiment 4.

The functions of the data processing unit 103, the plasma control unit 101 and the current adjustment unit 102 in the control unit 100A of the microwave heating device 10, are implemented by a processing circuit. Namely, the control unit 100A of the microwave heating device 10 includes the processing circuit for implementing the functions. The processing circuit may be, as shown in FIG. 9A, a processing circuit 100a as dedicated hardware, or may be, as shown in FIG. 9B, a processor 100b which executes programs stored in a memory 100c.

When the data processing unit 103, the plasma control unit 101 and the current adjustment unit 102 correspond to dedicated hardware as shown in FIG. 9A, the processing circuit 100a is, for example, a single circuit, a composite circuit, a programmed processor, a parallel-programmed processor, an Application Specific Integrated Circuit (ASIC), a Field-programmable Gate Array (FPGA) or any combination thereof. The functions of the data processing unit 103, the plasma control unit 101 and the current adjustment unit 102 may be implemented by their respective processing circuits, or the functions may be implemented collectively by one processing circuit.

When the data processing unit 103, the plasma control unit 101 and the current adjustment unit 102 correspond to the processor 100b as shown in FIG. 9B, their respective functions are implemented by software, firmware or a combination of software and firmware. The software and the firmware are each written as a program(s) and stored in the memory 100c. The processor 100b reads out and executes programs stored in the memory 100c to thereby implement the functions of the data processing unit 103, the plasma control unit 101 and the current adjustment unit 102. Namely, the data processing unit 103, the plasma control unit 101 and the current adjustment unit 102 are provided with the memory 100c for storing the programs by which, when they are executed by the processor 100b, the steps shown in FIG. 10 to be described later are eventually executed. Further, it can also be said that these programs are programs for causing a computer to execute steps or processes of the data processing unit 103, the plasma control unit 101 and the current adjustment unit 102.

Here, the processor 100b means, for example, a Central Processing Unit (CPU), a processing device, an arithmetic device, a processor, a microprocessor, a microcomputer, a Digital Signal Processor (DSP), or the like.

The memory 100c may, for example, be a non-volatile or volatile semiconductor memory such as a Random Access Memory (RAM), a Read Only Memory (ROM), a flash memory, an Erasable Programmable ROM (EPROM), an Electrically EPROM (EEPROM) or the like; a magnetic disc such as a hard disc, a flexible disc or the like; or an optical disc such as a mini disc, a Compact Disc (CD), a Digital Versatile Disc (DVD) or the like.

It is noted that the functions of the data processing unit 103, the plasma control unit 101 and the current adjustment unit 102 may be implemented partly by dedicated hardware and partly by software or firmware. In this manner, using hardware, software, firmware or any combination thereof, the processing circuit in the microwave heating device 10 can implement the functions.

Next, description will be made about operations of the control unit 100A.

Figure 10:
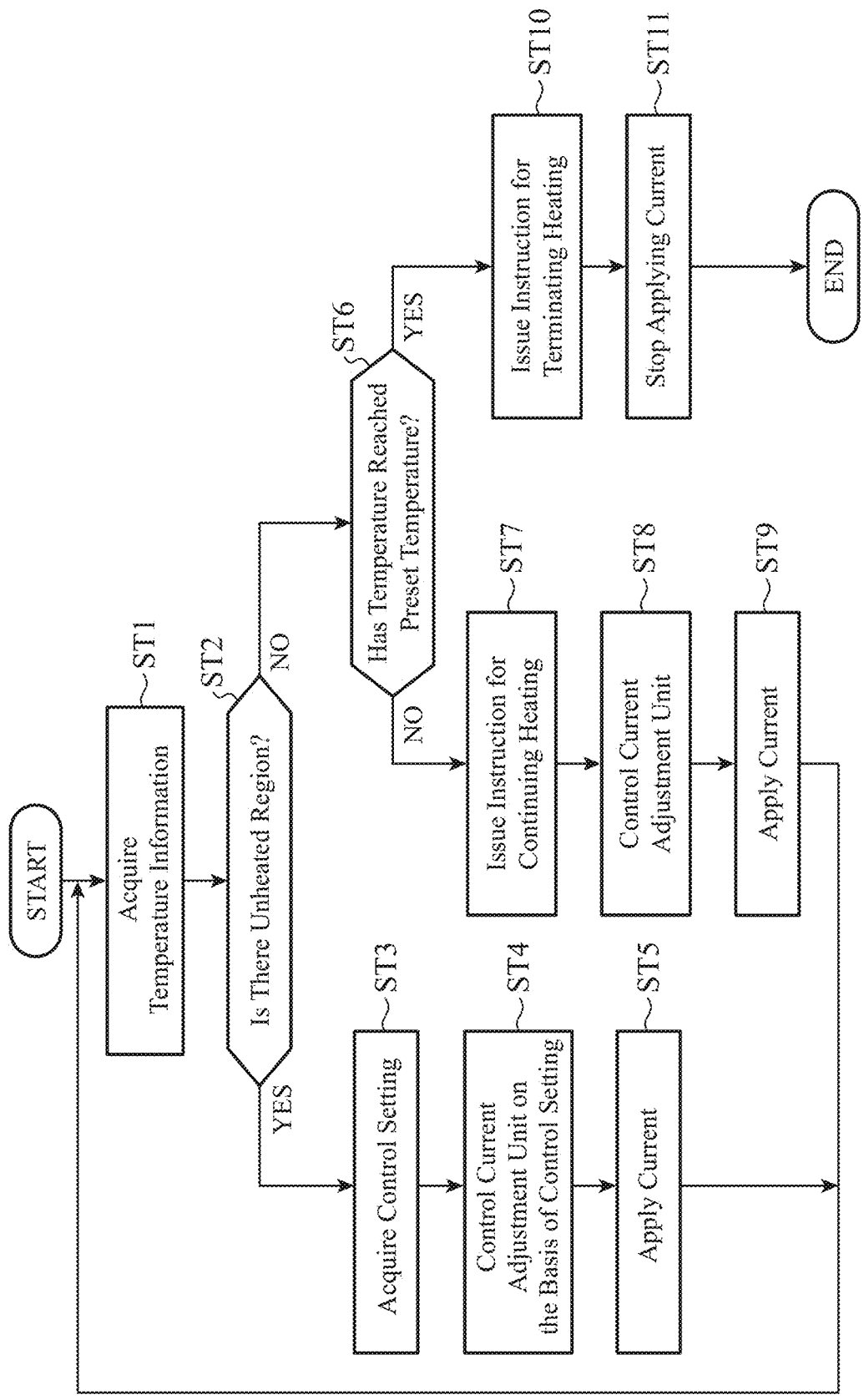
FIG. 10 is a flowchart showing operations of the control unit in the microwave heating device according to Embodiment 4.

FIG. 10 is a flowchart showing the operations of the control unit 100A in the microwave heating device 10 according to Embodiment 4.

Upon acquisition of the temperature information from the temperature monitor 200 (Step ST1), the data processing unit 103 refers to a portion of the temperature information corresponding to the region near the heating target X, to thereby determine whether or not there is an unheated region (Step ST2). If there is an unheated region (Step ST2; YES), the data processing unit 103 refers to the database 104 to thereby acquire a control setting matched with the temperature information acquired in Step ST1 (Step ST3). The data processing unit 103 outputs the acquired control setting to the plasma control unit 101. The plasma control unit 101 controls the current adjustment unit 102 on the basis of the inputted control setting (Step ST4). The current adjustment unit 102 applies a current(s) to the electrodes 42 of the hollow dielectric member(s) 4 on the basis of such a control in Step ST4 (Step ST5). Thereafter, processing in the flowchart returns to Step ST1.

In contrast, if there is no unheated region (Step ST2; NO), the data processing unit 103 looks up the temperature of the heating target X, to thereby determine whether or not it has reached a preset temperature (Step ST6). When the temperature of the heating target X has not reached the preset temperature (Step ST6; NO), the data processing unit 103 instructs the plasma control unit 101 to continue heating using the current control setting (Step ST7). The plasma control unit 101 controls the current adjustment unit 102 on the basis of the instruction inputted from the data processing unit 103 (Step ST8). The current adjustment unit 102 applies a current(s) to the electrodes 42 of the hollow dielectric member(s) 4 on the basis of such a control in Step ST8 (Step ST9). Thereafter, processing in the flowchart returns to Step ST1.

On the other hand, when the temperature of the heating target X has reached the preset temperature (Step ST6; YES), the data processing unit 103 instructs the plasma control unit 101 to terminate heating (Step ST10). On the basis of the instruction inputted from the data processing unit 103, the plasma control unit 101 controls the current adjustment unit 102 to thereby stop applying the current(s) (Step ST11), so that the processing is terminated.

It is noted that, in the foregoing flowchart, processing is shown that terminates heating on the basis of the temperature of the heating target X determined in the determination processing of Step ST6; however, the heating may terminate in response to a predetermined heating period.

As described above, according to Embodiment 4, the control unit 100A includes the data processing unit 103 for acquiring the temperature information indicating a temperature distribution in the heating chamber 1, and then referring to the database 104 in which control settings for controlling the state of each of the hollow dielectric members 4 are stored, to thereby acquire one of the control settings which is matched with the acquired temperature information. The plasma control unit 101 controls the state of each of the hollow dielectric members 4 in accordance with the control setting acquired by the data processing unit 103. The current adjustment unit 102 adjusts, under the control of the plasma control unit, each current to be applied to the electrodes.

Accordingly, the plasma state of each of the hollow dielectric members 4 can be controlled on the basis of the temperature distribution in the heating chamber. It is possible to suppress uneven heating of the heating target.

It is noted that, in the foregoing Embodiment 4, a configuration is shown in which the microwave heating device 10 includes the database 104; however, an external device may include the database 104.

Embodiment 5

In Embodiment 5, a configuration in which the database 104 is updated using temperature information acquired by the temperature monitor 200 will be described.

Figure 11:
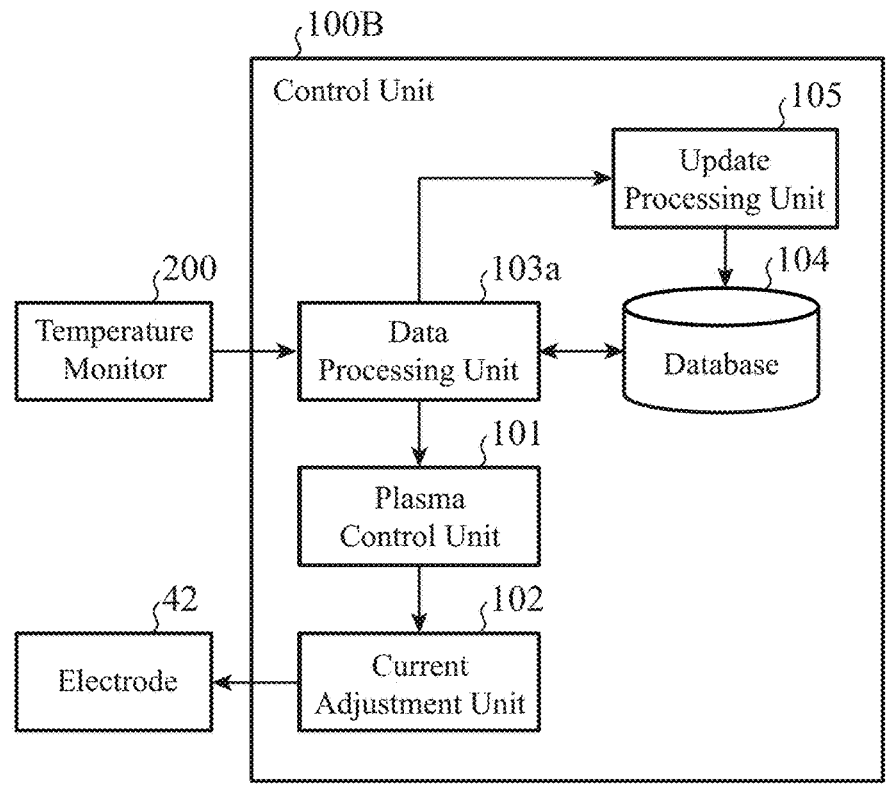
FIG. 11 is a block diagram showing a configuration of a control unit in a microwave heating device according to Embodiment 5.

FIG. 11 is a block diagram showing a configuration of a control unit 100B in a microwave heating device 10 according to Embodiment 5.

The control unit 100B of Embodiment 5 is configured by the provision of a data processing unit 103a instead of the data processing unit 103 in the control unit 100A shown in Embodiment 4 and by the addition of an update processing unit 105.

Note that, in the following, with respect to the components same as or equivalent to the components of the control unit 100A in the microwave heating device 10 according to Embodiment 4, the same reference numerals as the reference numerals used in Embodiment 4 are given thereto, and description thereof will be omitted or simplified.

The data processing unit 103a outputs, out of pieces of temperature information inputted from the temperature monitor 200, each piece of temperature information after change of the plasma state of the hollow dielectric member 4 by the plasma control unit 101 and the current adjustment unit 102, to the update processing unit 105. The update processing unit 105 receives from the data processing unit 103a, an input of the temperature information after the change of the plasma state. The update processing unit 105 causes the database 104 to store the received temperature information after the change of the plasma state. The database 104 stores temperature information before the change of the plasma state, a control setting, and the temperature information after the change of the plasma state so that they are associated with each other.

At the time of acquiring a control setting on the basis of the temperature information inputted from the temperature monitor 200, the data processing unit 103a refers also to the temperature information after the change of the plasma state, to thereby acquire the control setting with which an intended temperature distribution will be established. Because the update processing unit 105 updates the database 104 by using the temperature information after the change of the plasma state, it becomes possible for the data processing unit 103 to acquire control information by which the heating target X will get into a suitably heated state.

Further, the update processing unit 105 may perform learning processing on the control setting by using information indicating how the temperature information has varied after the change of the plasma state. On the basis of the learning result on the control setting, the update processing unit 105 updates the control setting stored in the database 104. Because the update processing unit 105 performs learning processing on the control setting, it is possible to quickly perform optimum control of the plasma state.

Next, hardware configuration examples of the control unit 100B will be described. Note that the configuration that is the same as that in Embodiment 4 will be omitted from description.

The data processing unit 103a and the update processing unit 105 in the control unit 100B correspond to the processing circuit 100a shown in FIG. 9A, or the processor 100b shown in FIG. 9B which executes programs stored in the memory 100c.

As described above, according to Embodiment 5, the control unit 100B includes the update processing unit 105 for acquiring, through the data processing unit 103, the temperature information after change of the plasma state by the plasma control unit 101, and then performing updating by causing the database 104 to associate the temperature information before and after the change of the plasma state with the corresponding control setting and to store resultant data. The data processing unit 103 refers to the database 104 after the updating, to thereby acquire a control setting on the basis of the temperature information that is currently given and the temperature information before and after application of the current.

Accordingly, when the update processing has been repeated multiple times, it is possible to heat the heating target up to a state without uneven heating. Further, it is possible to accumulate each piece of information after the change of the plasma state, so that the control setting with which a desired temperature distribution will be established can be acquired more easily.

In another aspect, according to Embodiment 5, the update processing unit 105 performs learning processing on the control setting by using information indicating how the temperature information has varied after the change of the plasma state. This makes it possible to perform optimum control of the plasma state for the temperature distribution in the heating chamber.

It is noted that, in the foregoing Embodiment 4 and Embodiment 5, the description has been made about the control units 100A, 100B to be applied to the microwave heating devices 10 of Embodiments 1 to 3 shown in FIG. 2, FIG. 4 and FIG. 6. However, the microwave heating devices 10 to which the control units 100A, 100B are to be applied, are not limited to those having the configurations shown in FIG. 2, FIG. 4 and FIG. 6, and may include, for example, a microwave heating device 10 shown in FIG. 12.

Figure 12:
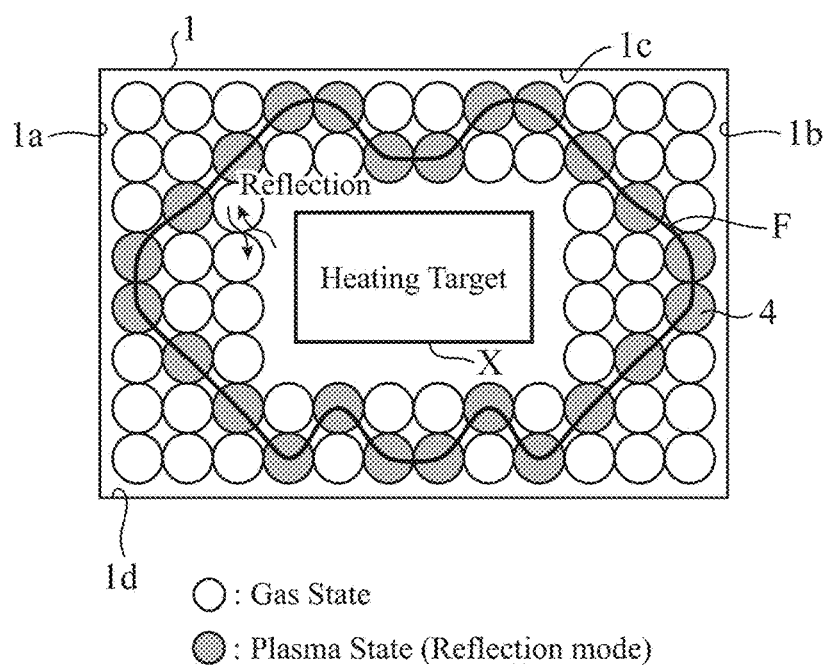
FIG. 12 is a diagram showing another configuration example of the microwave heating device according to either Embodiment 4 or 5, and is a top-side schematic view of an internal configuration of the microwave heating device.

FIG. 12 is a diagram showing another configuration example of the microwave heating device 10 according to either Embodiment 4 or 5, and is a top-side schematic view of an internal configuration of the microwave heating device 10. In FIG. 12, the control units 100A, 100B are omitted from the illustration.

Hollow dielectric members 4 are provided in a line along everyone of the lateral-side walls 1a, 1b, 1c, 1d of the heating chamber 1 that cross the face at which the radiation element 3 is provided (for example, the top face shown in FIG. 1). Further, rows of hollow dielectric members 4 are stacked. In the example of FIG. 12, a case is shown where three rows of hollow dielectric members 4 provided in a line along the wall 1a are stacked. A case is also shown where three rows of hollow dielectric members 4 provided in a line along the wall 1b are stacked; two rows of hollow dielectric members 4 provided in a line along the wall 1c are stacked; and two rows of hollow dielectric members 4 provided in a line along the wall 1d are stacked.

On the basis of the temperature information inputted from the temperature monitor 200, the control unit 100A or 100B performs control to put any given hollow dielectric members 4 adjacent to each other among the multiple hollow dielectric members 4, into the plasma state as the reflection mode. Further, the control unit performs control to put hollow dielectric members 4 other than the above, into the gas state in which the microwave is allowed to be transmitted. This causes the hollow dielectric members 4 to forma reflection surface. In the example of FIG. 12, a case is shown where a virtual reflection surface F is formed. Formation of a virtual reflection surface is controlled on the basis of the temperature information inputted from the temperature monitor 200, so that the reflection direction of the microwave is controlled, and thus the heating region is controlled. It is possible to perform more effective heating control on the basis of the temperature information inputted from the temperature monitor 200.

As just described, according to another configuration in Embodiment 5, rows of hollow dielectric members 4 provided in a line along each of the walls 1a, 1b, 1c, 1d that cross the wall at which the radiation element 3 is provided are provided, the rows along the corresponding one of walls 1a, 1b, 1c, 1d being stacked. The plasma control unit 101 controls the current to be applied to the electrodes 42, in accordance with the control setting acquired by the data processing unit 103, to thereby perform control of the hollow dielectric members 4 so that any given adjacent three or more of them are put into the plasma state in which the microwave is reflected, and hollow dielectric members 4 other than the three or more are put into the gas state in which the microwave is allowed to be transmitted.

Accordingly, a virtual reflection surface matched with the temperature distribution in the heating chamber is formed, so that it is possible to perform heating region control matched with the temperature distribution. Thus, it is possible to perform more effective heating control matched with the temperature distribution.

Embodiment 6

In Embodiment 6, a configuration in which a given region in the heating chamber 1 is heated intensively will be described.

Figure 13:
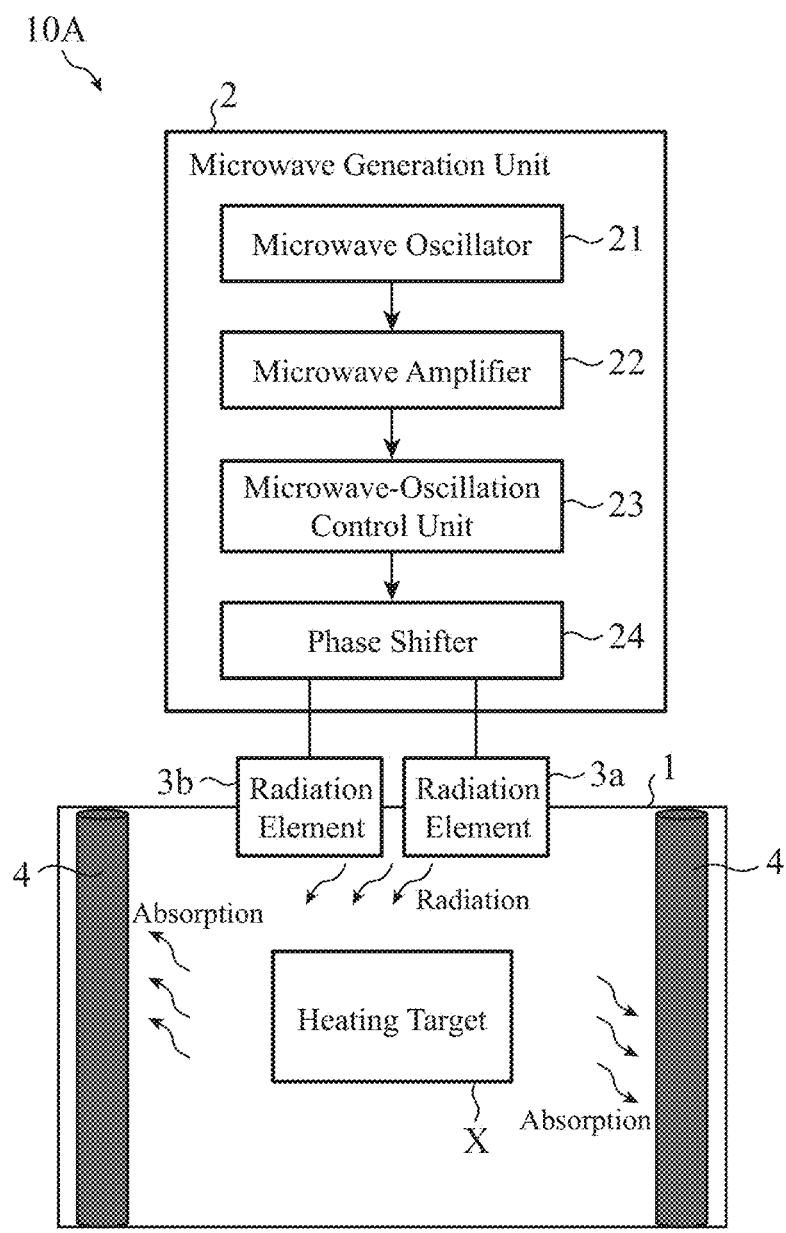
FIG. 13 is a lateral-side schematic view showing a configuration of a microwave heating device according to Embodiment 6.

FIG. 13 is a lateral-side schematic view showing the configuration of a microwave heating device 10A according to Embodiment 6. Note that, in FIG. 13, a control unit 100C is omitted from the illustration.

Figure 14:
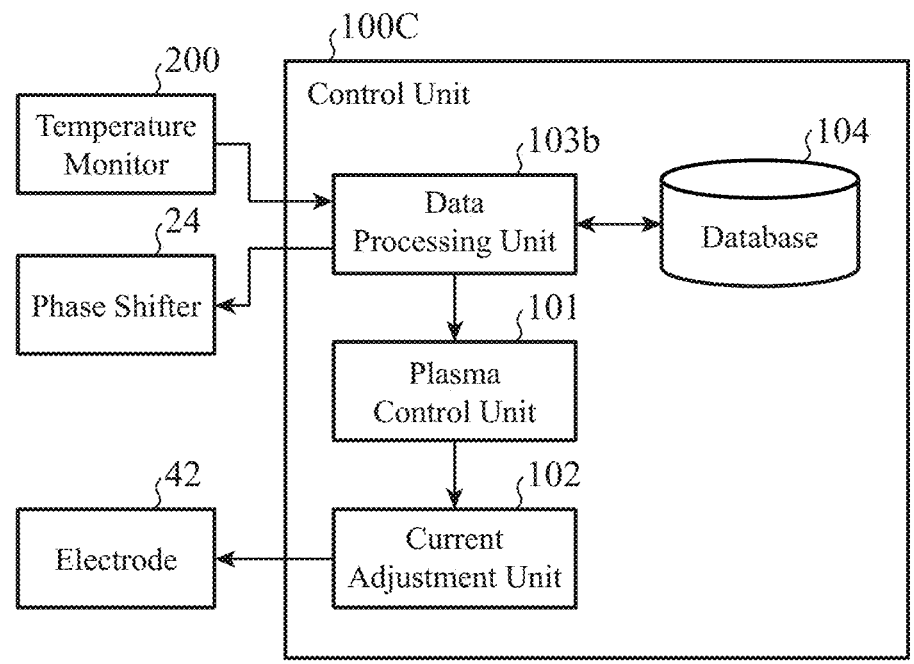
FIG. 14 is a block diagram showing a configuration of a control unit in the microwave heating device according to Embodiment 6.

FIG. 14 is a block diagram showing a configuration of the control unit 100C in the microwave heating device 10A according to Embodiment 6.

The microwave heating device 10A of Embodiment 6 is configured by the additional provision of a phase shifter 24 in the microwave generation unit 2 of the microwave heating device 10 shown in Embodiment 4. Further, it is configured by the provision of two radiation elements 3. Furthermore, it is configured by the provision of the control unit 100C instead of the control unit 100A in the microwave heating device 10 shown in Embodiment 4.

Note that, in the following, with respect to the parts same as or equivalent to the components of the microwave heating device 10 according to Embodiment 4, the same reference numerals as the reference numerals used in Embodiment 4 are given thereto, and description thereof will be omitted or simplified.

A radiation element 3a and a radiation element 3b are provided at positions spatially apart from each other, and each radiate the microwave generated in the microwave generation unit 2 into the heating chamber 1. The radiation elements 3a, 3b may be of any type. Further, the number of thus-provided radiation elements 3 may be two or more, and multiple radiation elements 3 may be provided in a single straight line.

To the radiation elements 3a, 3b, the phase shifter 24 in the microwave generation unit 2 is connected. The phase shifter 24 makes a difference in phase between the microwaves radiated from the respective radiation elements 3a, 3b. Because of the phase difference made by the phase shifter 24, the radiation directions of the microwaves radiated from the radiation elements 3a, 3b are controlled at least in one direction.

Since the heating chamber 1 is a closed space, a standing wave is generated therein, so that the beam of the microwave cannot be freely controlled. Thus, the plasma control unit 101 controls at least one of the hollow dielectric members 4 to be put into the plasma state as the absorption mode. Accordingly, a microwave in the heating chamber 1 is absorbed in the hollow dielectric member 4. Because the microwave is absorbed, the standing wave in the heating chamber is suppressed, so that, in the heating chamber 1, the beam of the microwave is controlled like in an open space.

With reference to FIG. 14, description will be made about details of the control unit 100C.

Like in Embodiment 4, a data processing unit 103b in the control unit 100C refers to the temperature information inputted from the temperature monitor 200 to thereby determine whether or not there is an unheated region in the region near the heating target X. When having determined that there is an unheated region in the region near the heating target X, the data processing unit 103b outputs to the phase shifter 24, a control instruction for causing it to make a difference in phase between the radiated microwaves. Further, when having outputted to the phase shifter 24 the control instruction for causing it to make a difference in phase between the radiated microwaves, the data processing unit 103b acquires from the database 104, a control setting for controlling at least one of the hollow dielectric members 4 to be put into the plasma state as the absorption mode. The database 104 stores control settings for the cases where a difference is made in phase between the microwaves by the phase shifter 24.

Figure 15:
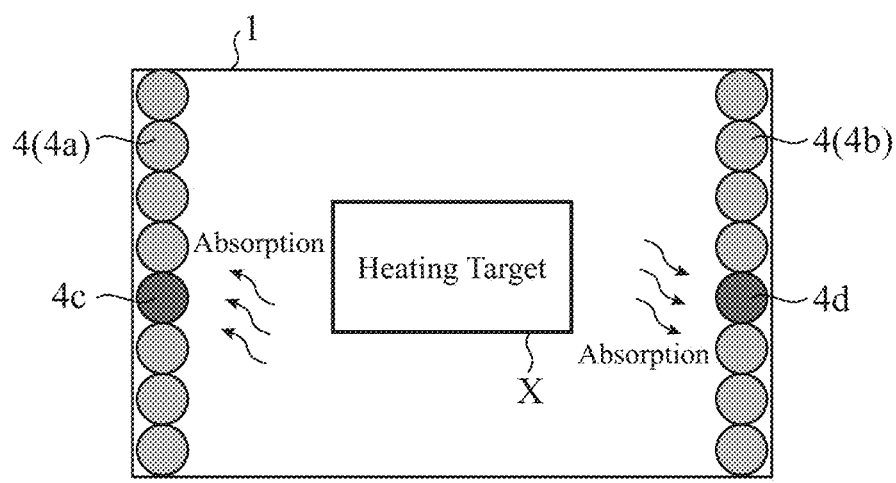
FIG. 15 is a top-side schematic view showing an internal configuration of the microwave heating device according to Embodiment 6.

FIG. 15 is a top-side schematic view showing an internal configuration of the microwave heating device 10A according to Embodiment 6.

Hollow dielectric members 4 are provided in a line along each of the walls that cross a straight line extending in an alignment direction of the radiation elements 3a, 3b. In the example of FIG. 15, a case is shown where hollow dielectric members 4a are provided in a line along the wall 1a that crosses the straight line extending in the alignment direction of the radiation elements 3a, 3b, and hollow dielectric members 4b are provided in a line along the wall 1b that crosses the straight line extending in the alignment direction of the radiation elements 3a, 3b.

On the basis of the control setting acquired by the data processing unit 103b, the plasma control unit 101 controls at least one of the hollow dielectric members 4 to be put into the plasma state as the absorption mode, and the other hollow dielectric members 4 to be put into the plasma state as the reflection mode. In the example of FIG. 15, a case is shown where, out of the row of the hollow dielectric members 4a provided along the wall 1a, the plasma control unit 101 controls one hollow dielectric member 4c to be put into the plasma state as the absorption mode, and the other hollow dielectric members 4a to be put into the plasma state as the reflection mode. A case is also shown where, out of the row of hollow dielectric members 4b provided along the wall 1b, the plasma control unit similarly controls one hollow dielectric member 4d to be put into the plasma state as the absorption mode, and the other hollow dielectric members 4b to be put into the plasma state as the reflection mode.

By employing the configuration shown in FIG. 15, the radiation direction of the microwave can be changed in the alignment direction of the radiation elements 3a, 3b.

Next, hardware configuration examples of the control unit 100C will be described. Note that the configuration that is the same as that in Embodiment 4 will be omitted from description.

The data processing unit 103b in the control unit 100C corresponds to the processing circuit 100a shown in FIG. 9A, or the processor 100b shown in FIG. 9B which executes programs stored in the memory 100c.

Next, description will be made about operations of the control unit 100C.

Figure 16:
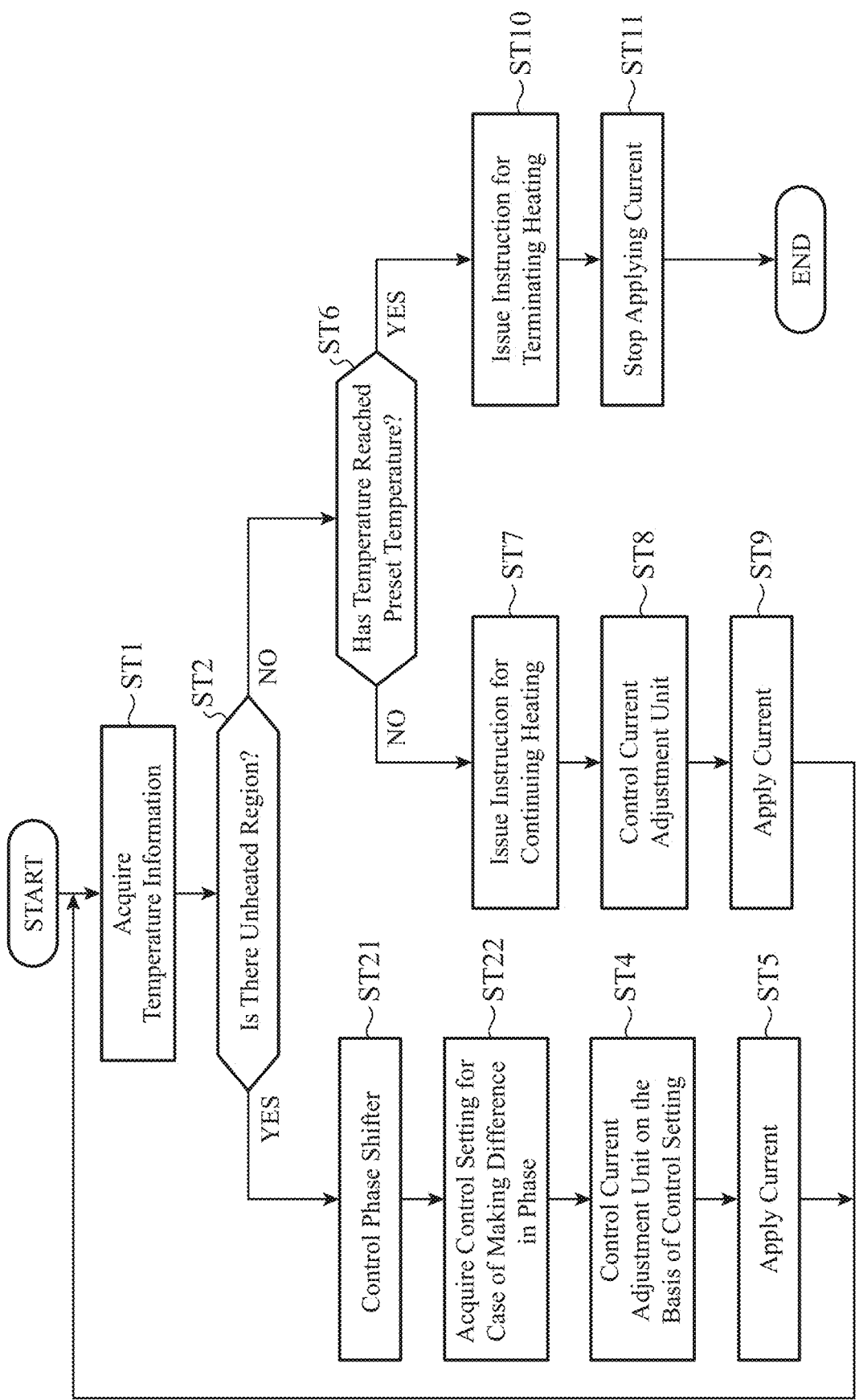
FIG. 16 a flowchart showing operations of the control unit in the microwave heating device according to Embodiment 6.

FIG. 16 is a flowchart showing the operations of the control unit 100C in the microwave heating device 10A according to Embodiment 6.

Upon acquisition of the temperature information from the temperature monitor 200 (Step ST1), the data processing unit 103b refers to a portion of the temperature information corresponding to the region near the heating target X, to thereby determine whether or not there is an unheated region (Step ST2). If there is an unheated region (Step ST2; YES), the data processing unit 103b outputs to the phase shifter 24, a control instruction for causing it to make a difference in phase between the microwaves radiated (Step ST21).

Further, the data processing unit 103b refers to the database 104, to thereby acquire the control setting for the case where the difference is made in phase between the microwaves radiated from the radiation elements 3a, 3b (Step ST22). The data processing unit 103b outputs the acquired control setting to the plasma control unit 101. Thereafter, processing in the flowchart proceeds to Step ST4. On the other hand, if there is no unheated region (Step ST2; NO), processing proceeds to Step ST6.

Other arrangement examples of the hollow dielectric members 4 in the microwave heating device 10A will be described. The arrangement of the hollow dielectric members 4 in the microwave heating device 10A may be determined freely if it is an arrangement capable of intensively heating the heating target X.

Figure 17:
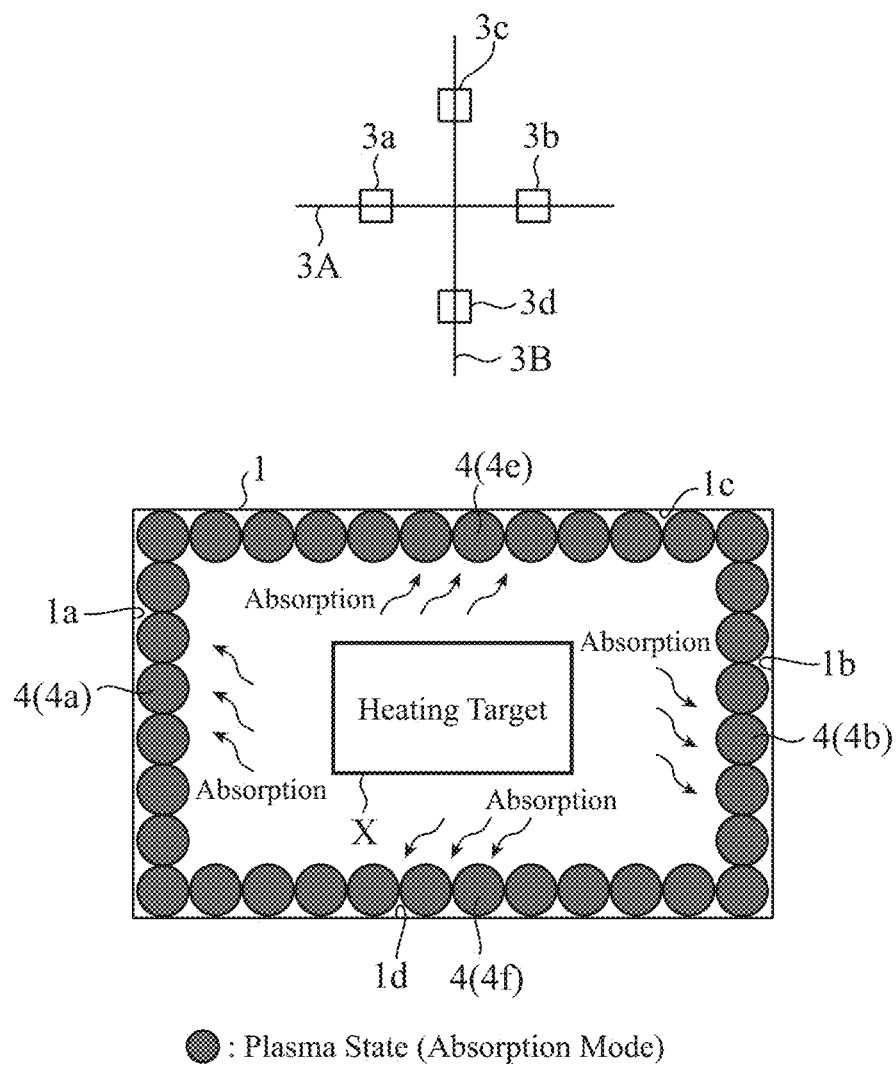
FIG. 17 is a diagram showing another arrangement example of hollow dielectric members in the microwave heating device according to Embodiment 6.

FIG. 17 is a diagram showing another arrangement example of the hollow dielectric members 4 in the microwave heating device 10A according to Embodiment 6. FIG. 17 is a top-side schematic view showing an internal configuration of the heating chamber 1.

In the foregoing FIG. 13, the alignment direction of the radiation elements 3a, 3b is assumed to be one direction; however, a configuration may be employed in which two or more radiation elements 3 are aligned in each of mutually perpendicular straight lines. The phase shifter 24 makes a difference in phase between the microwaves radiated from the respective radiation elements 3. Because of the phase differences made by the phase shifter 24, the radiation direction of the microwave radiated from every radiation element 3 is controlled.

In this case, as shown in FIG. 17, hollow dielectric members 4 are provided in a line along each of: the walls 1a, 1b that cross a straight line 3A extending in the alignment direction of the radiation elements 3a, 3b; and the walls 1c, 1d that cross a straight line 3B extending in the alignment direction of the radiation elements 3c, 3d. Namely, a row of the hollow dielectric members 4 is provided along every wall that crosses the face at which the radiation elements 3 are provided (for example, the top face shown in FIG. 13). Out of the hollow dielectric members 4 provided in a line along each of the walls 1a, 1b, 1c, 1d, the plasma control unit 101 controls at least one hollow dielectric member 4 to be put into the plasma state as the absorption mode.

According to such a configuration, generation of the standing wave is suppressed on a plane that is parallel to the alignment plane of four or more radiation elements 3, so that the microwaves are controlled two-dimensionally. This makes it possible to concentrate the microwave beams on a given point on the plane that is parallel to the plane on which the four or more radiation elements 3 are provided.

Figure 18:
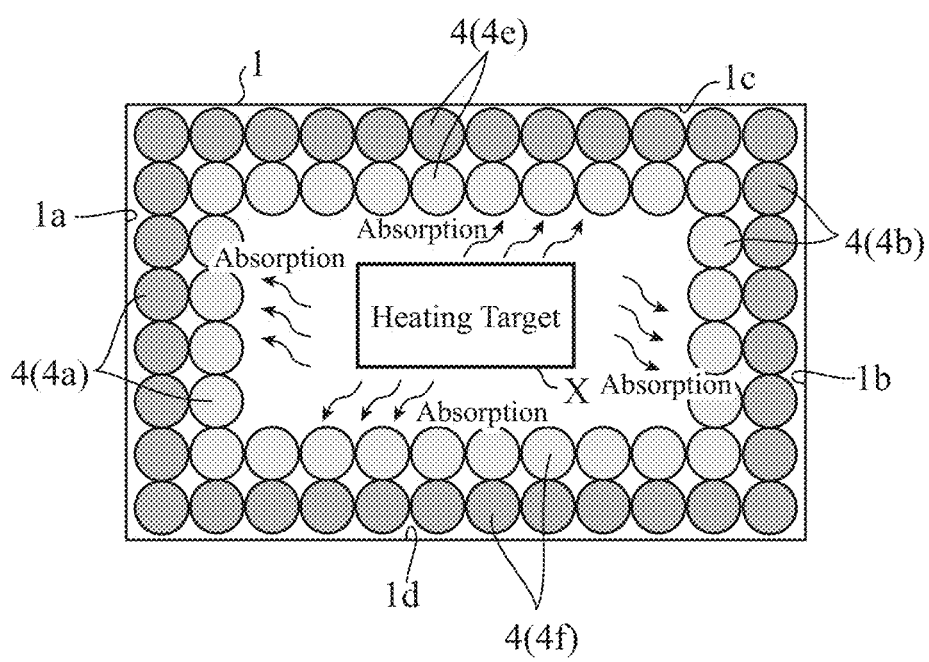
FIG. 18 is a diagram showing another arrangement example of hollow dielectric members in the microwave heating device according to Embodiment 6.

FIG. 18 is a diagram showing another arrangement example of the hollow dielectric members 4 in the microwave heating device 10A according to Embodiment 6. FIG. 18 is a top-side schematic view showing an internal configuration of the heating chamber 1.

In FIG. 18, a case is shown where, hollow dielectric members 4 are provided in a line along each of the walls 1a, 1b, 1c, 1d of the heating chamber 1 and two rows of such hollow dielectric members provided in a line are stacked, to thereby form rows of hollow dielectric members 4a, 4b, 4e, 4f. Namely, two or more rows of hollow dielectric members 4 are provided along every wall that crosses the face at which the radiation elements 3 are provided (for example, the top face shown in FIG. 13).

On the basis of the control setting inputted from the data processing unit 103b, the plasma control unit 101 makes a difference between current values for the respective rows of hollow dielectric members 4a; a difference between current values for the respective rows of hollow dielectric members 4b; a difference between current values for the respective rows of hollow dielectric members 4e; and a difference between current values for the respective rows of hollow dielectric members 4f. The plasma control unit 101 controls the rows of hollow dielectric members 4 so that the rows are put into the plasma states as the absorption modes with different absorption efficiencies. Specifically, the plasma control unit 101 sets a small current value for the hollow dielectric members 4 that form the row positioned nearer to the heating target X, and sets a large current value for the hollow dielectric members 4 that form the row positioned far from the heating target X. Accordingly, microwave absorption capability is enhanced and wave impedance matching is established with a region in which the heating target X is placed, so that it is possible to suppress the reflection of the microwave toward the center of the heating chamber 1. This makes it possible to precisely control the beam of the microwave, and also to precisely control heating of the heating target X.

As described above, according to Embodiment 6, two or more radiation elements 3a, 3b are provided, and the microwave generation unit 2 has the phase shifter 24 for making a difference in phase between the microwaves radiated by the two or more radiation elements 3a, 3b. Two or more hollow dielectric members 4 are provided in a line along each of the walls 1a, 1b that cross the straight line extending in the alignment direction of the two or more radiation elements 3a, 3b. The plasma control unit 101 controls at least one hollow dielectric member 4 among the hollow dielectric members 4, to be put into the plasma state in which the microwave is absorbed.

Accordingly, the radiation direction of the microwave can be changed in the alignment direction of the radiation elements. Thus, it is possible to concentrate the beams of the microwaves on a region desired to be heated intensively, to thereby efficiently heat a region to be heated.

In another aspect, according to Embodiment 6, two or more radiation elements 3 are aligned in a first alignment direction and other two or more radiation elements 3 are aligned in a second alignment direction, and the phase shifter 24 makes a difference in phase between the radiation elements 3 each provided in the corresponding one of the first alignment direction and the second alignment direction. Two or more hollow dielectric members 4 are provided in a line along each of the walls that cross a straight line extending in the first alignment direction, and two or more hollow dielectric members 4 are provided in a line along each of the walls that cross a straight line extending in the second alignment direction. The plasma control unit 101 controls, at least one hollow dielectric member 4 among the hollow dielectric members 4 provided along the walls 1a, 1b that cross the straight line extending in the first alignment direction, and at least one hollow dielectric member 4 among the hollow dielectric members 4 provided along the walls 1c, 1d that cross the straight line extending in the second alignment direction, to be put into the plasma state in which the microwave is absorbed.

Accordingly, generation of the standing wave on the plane that is parallel to the alignment plane of the radiation elements can be suppressed. Thus, it is possible to concentrate the beams of microwaves on a given point on the plane that is parallel to the alignment plane of the radiation elements.

In another aspect, according to Embodiment 6, rows of the hollow dielectric members 4 provided in a line along each of the walls 1a, 1b which cross the straight line extending in the first alignment direction are stacked, and rows of the hollow dielectric members 4 provided in a line along each of the walls 1c, 1d which cross the second alignment direction are stacked. Thus, it is possible to effectively suppress the standing wave generated in the heating chamber, so that the beams of the microwaves radiated into the heating chamber can be concentrated on the heating target.

It is noted that, in the foregoing Embodiment 6, the description has been made using exemplary cases to be applied to the microwave heating device 10 according to Embodiment 4; however, this embodiment may be applied to the microwave heating device 10 according to Embodiment 5.

Other than the above, unlimited combination of the embodiments, modification of any component in the embodiments and omission of any component in the embodiments may be made in the present invention, without departing from the scope of the invention.

INDUSTRIAL APPLICABILITY

It is preferable that the technique according to the invention be applied to a heating device or the like in which uneven heating is to be suppressed by using plasma.

REFERENCE SIGNS LIST

1: heating chamber, 1a, 1b, 1c, 1d: wall, 2: microwave generation unit, 3, 3a, 3b: radiation element, 4, 4a, 4b, 4c, 4d, 4e, 4f: hollow dielectric member, 10, 10A: microwave heating device, 21: microwave oscillator, 22: microwave amplifier, 23: microwave-oscillation control unit, 24: phase shifter, 41: gas, 42: electrode, 100, 100A, 100B, 100C: control unit, 101: plasma control unit, 102: current adjustment unit, 103, 103a, 103b: data processing unit, 104: database, 105: update processing unit, 200: temperature monitor.

The invention claimed is:

1. A microwave heating device, comprising:
   a heating chamber capable of storing therein a heating target and having walls each made of a conductor;
   a microwave generator to generate a microwave;
   at least one radiation element to radiate, into the heating chamber, the microwave generated by the microwave generator, the radiation element being provided at one of the walls;
   at least one hollow dielectric member in which a gas is sealed, the hollow dielectric member having electrodes at both end portions thereof; and
   processing circuitry to control a state of the hollow dielectric member; and to adjust a current to be applied to the electrodes of the hollow dielectric member, the processing circuitry being connected to the electrodes;
   wherein the at least one hollow dielectric member is provided along one of the walls which is other than the wall at which the radiation element is provided; and
   wherein the processing circuitry controls the state of the hollow dielectric member so that the hollow dielectric member is put into one of states of: a plasma state in which the microwave is reflected by the gas; a plasma state in which the microwave is absorbed by the gas; and a gas state in which the microwave is allowed to be transmitted through the gas.

2. The microwave heating device of claim 1, wherein the at least one hollow dielectric member includes two or more hollow dielectric members provided in a line along the wall which is other than the wall at which the radiation element is provided; and
   wherein the processing circuitry controls states of respective two or more hollow dielectric members among the hollow dielectric members provided in a line so that the respective two or more hollow dielectric members are put into the plasma state in which the microwave is reflected.

3. The microwave heating device of claim 2, wherein the at least one hollow dielectric member includes: two or more hollow dielectric members provided in a line at respective positions about 0.25 wavelength away from a first wall among the walls which is other than the wall at which the radiation element is provided; and two or more hollow dielectric members provided in a line at respective positions about 0.25 wavelength away from a second wall among the walls which is other than the wall at which the radiation element is provided, the second wall being opposite to the first wall across the heating target; and
   wherein the processing circuitry performs control to make switching between: a first set of states in which the hollow dielectric members provided in a line along the first wall are put into the plasma state in which the microwave is reflected while the hollow dielectric members provided in a line along the second wall are put into the gas state in which the microwave is allowed to be transmitted; and a second set of states in which the hollow dielectric members provided in a line along the second wall are put into the plasma state in which the microwave is reflected while the hollow dielectric members provided in a line along the first wall are put into the gas state in which the microwave is allowed to be transmitted.

4. The microwave heating device of claim 3, wherein the processing circuitry acquires temperature information indicating a temperature distribution in the heating chamber, and refers to a database in which one or more control settings for controlling the state of each of the hollow dielectric members are stored, to thereby acquire one of the control settings which is matched with the acquired temperature information;
   wherein the processing circuitry controls the state of each of the hollow dielectric members in accordance with the control setting acquired; and
   wherein the processing circuitry adjusts the current to be applied to the electrodes.

5. The microwave heating device of claim 4, wherein the processing circuitry acquires the temperature information after change of the plasma state by the processing circuitry, and performs updating by causing the database to associate the temperature information before and after the change of the plasma state with a corresponding one of the control settings and to store resultant data; and
   wherein the processing circuitry refers to the database after the updating, to thereby acquire one of the control settings on a basis of the temperature information that is currently given and the temperature information before and after application of the current.

6. The microwave heating device of claim 4, wherein the hollow dielectric members include rows of hollow dielectric members provided in a line along one of the walls which crosses the wall at which the radiation element is provided, the rows along the wall being stacked; and
   wherein the processing circuitry controls the current to be applied to the electrodes, in accordance with the control setting acquired, to thereby perform control of the hollow dielectric members so that any given adjacent three or more of the members are put into the plasma state in which the microwave is reflected, and hollow dielectric members other than the three or more are put into the gas state in which the microwave is allowed to be transmitted.

7. The microwave heating device of claim 2, comprising two or more radiation elements included in the at least one radiation element;
   wherein the microwave generator has a phase shifter to make a difference in phase between microwaves each of which is the microwave radiated by a corresponding one of the two or more radiation elements;
   wherein the hollow dielectric members include two or more hollow dielectric members provided in a line along one of the walls which crosses a straight line extending in an alignment direction of the two or more radiation elements; and
   wherein the processing circuitry controls at least one of the hollow dielectric members provided in a line, to be put into the plasma state in which the microwave is absorbed.

8. The microwave heating device of claim 7, wherein the radiation elements include two or more radiation elements aligned in a first alignment direction and two or more radiation elements aligned in a second alignment direction;
   wherein the phase shifter makes a difference in phase between the radiation elements each provided in a corresponding one of the first alignment direction and the second alignment direction;
   wherein the hollow dielectric members include two or more hollow dielectric members provided in a line along one of the walls which crosses a straight line extending in the first alignment direction, and two or more hollow dielectric members provided in a line along one of the walls which crosses a straight line extending in the second alignment direction; and wherein the processing circuitry controls: at least one of the hollow dielectric members provided along the wall which crosses the straight line extending in the first alignment direction; and at least one of the hollow dielectric members provided along the wall which crosses the straight line extending in the second alignment direction; to be put into the plasma state in which the microwave is absorbed.

9. The microwave heating device of claim 8, wherein the hollow dielectric members include stacked rows of the hollow dielectric members provided in a line along the wall which crosses the straight line extending in the first alignment direction, and stacked rows of the hollow dielectric members provided in a line along the wall which crosses the straight line extending in the second alignment direction.

10. The microwave heating device of claim 5, wherein the hollow dielectric members include rows of hollow dielectric members provided in a line along one of the walls which crosses the wall at which the radiation element is provided, the rows along the wall being stacked; and wherein the processing circuitry controls the current to be applied to the electrodes, in accordance with the control setting acquired, to thereby perform control of the hollow dielectric members so that any given adjacent three or more of the members are put into the plasma state in which the microwave is reflected, and hollow dielectric members other than the three or more are put into the gas state in which the microwave is allowed to be transmitted.

* * * * *